United States Patent
Snowdon et al.

(10) Patent No.: US 6,649,491 B2
(45) Date of Patent: Nov. 18, 2003

(54) METHOD OF FORMING REGULAR ARRAY OF MICROSCOPIC STRUCTURES ON A SUBSTRATE

(75) Inventors: James Kenneth Snowdon, Northumberland (GB); Marcus Matthias Batzill, New Orleans, LA (US); François Bardou, Molsheim (FR)

(73) Assignee: Ever 1391 Limited (GB)

(*) Notice: Subject to any disclaimer, the term of this patent is extended or adjusted under 35 U.S.C. 154(b) by 0 days.

(21) Appl. No.: 10/168,239
(22) PCT Filed: Jan. 23, 2001
(86) PCT No.: PCT/GB01/00222
§ 371 (c)(1), (2), (4) Date: Jun. 17, 2002
(87) PCT Pub. No.: WO01/56058
PCT Pub. Date: Aug. 2, 2001

(65) Prior Publication Data
US 2002/0181304 A1 Dec. 5, 2002

(30) Foreign Application Priority Data
Jan. 25, 2000 (GB) .......................................... 00001518

(51) Int. Cl.⁷ .......................................... H01L 21/322
(52) U.S. Cl. ........................................................ 438/473
(58) Field of Search ...................... 438/473, 798

(56) References Cited

U.S. PATENT DOCUMENTS

| | | | |
|---|---|---|---|
| 4,490,783 A | 12/1984 | McDonough et al. | 364/200 |
| 4,807,218 A * | 2/1989 | Gerber | 369/100 |
| 5,155,826 A | 10/1992 | Fadem | 395/425 |
| 6,128,214 A | 10/2000 | Kuekes et al. | 365/151 |
| 6,248,674 B1 | 6/2001 | Kamins et al. | 438/798 |
| 6,314,019 B1 | 11/2001 | Kuekes et al. | 365/151 |

FOREIGN PATENT DOCUMENTS

EP PCT/GB01/00222 6/2001

OTHER PUBLICATIONS

Batzill, M., et al., "Preferential Sputtering Induced Stress Domains and Mesoscopic Phase Separation on $CaF_2(111)$," *Physical Review Letters*, vol. 85, No. 4, pp. 780–783, (Jul. 24, 2000).
Facsko, S., et al., "Formation of Ordered Nanoscale Semiconductor Dots by Ion Sputtering," *Science*, vol. 285, pp. 1551–1553, (Sep. 3, 1999).
Wissing, M., et al., "An Apparatus for Glancing Incidence Ion Beam Polishing and Characterization of Surfaces to Angstrom–Scale Root–Mean–Square Roughness," *Rev. Sci. Instrum.*, vol. 67, No. 12, pp. 4314–4320, (Dec. 1996).

* cited by examiner

Primary Examiner—David Nelms
Assistant Examiner—Quoc Hoang
(74) Attorney, Agent, or Firm—Brinks, Hofer, Gilson & Lione; Daniel B. Schein, Esq.

(57) ABSTRACT

A method of forming a substantially regular array of microscopic structures on a surface of a sample (4) is described. The sample comprises a microscopic layer of at least one first material on a substrate of a second material, wherein the microscopic layer is sufficiently thin that stress fields at the interface of the microscopic layer and the substrate cause formation of separated regions of the first material on the substrate. The microscopic layer on the sample (4) is irradiated by means of a particle beam (5) at an acute angle α, to influence the direction of alignment of said separated regions and/or the relative position of adjacent said separated regions.

19 Claims, 2 Drawing Sheets

METHOD OF FORMING REGULAR ARRAY OF MICROSCOPIC STRUCTURES ON A SUBSTRATE

The present invention relates to a method of forming a substantially regular array of microscopic structures on a substrate. The invention relates particularly, but not exclusively, to a method of forming nanometer sized wire-like structures on a substrate.

Methods of imposing patterned surface structures on articles have applications in the fabrication of various devices, for example data storage media, microelectronic and micro-electromechanical devices, sensors, optoelectronic display devices, and other optical and optoelectronic components such as optical components for directing atomic beams, as well as applications in tissue engineering and for cell adhesion or non-adhesion, or for guiding motion or growth of cells, liquids or molecules, or in molecular scale filters. Known patterning processes involve optical lithography processes or direct-write patterning techniques such as electron beam lithography and scanning probe methods.

However, optical lithography processes suffer from the drawback that they are of limited resolution, and direct-write patterning techniques, although capable of achieving higher lateral resolution than optical lithography, are impracticable for use in mass production applications because the serial nature of the surface modification process is inherently slow. Also, when applied to larger areas of material, for example more than a few square centimeters, such processes suffer poor large scale dimensional accuracy, and in the case of patterning formed by step and scan techniques, poor registration between separate write operations and scanned regions is achieved.

Preferred embodiments of the present invention seek to overcome the above disadvantages of the prior art.

According to the present invention, there is provided a method of forming a substantially regular array of structures on a substrate, the method comprising:

providing a surface layer of a first material on a substrate of a second material, wherein said surface layer is sufficiently thin that stress fields at the interface of said surface layer and said substrate cause formation of separated regions of said first material on said substrate; and directing at least one first particle beam onto said surface layer and at a respective acute angle thereto to influence the direction of alignment of said separated regions and/or the relative position of adjacent said separated regions.

By directing at least one first particle beam onto the surface layer to influence the direction of alignment of said separated regions and/or the relative position of adjacent said separated regions, this provides the advantage that nanometer-scale structures having a high degree of regularity can be formed on the surface. Structures having such a high degree of regularity have a number of technical applications, and can either not be formed using conventional techniques, or can only be formed at significantly greater cost and/or complexity.

The step of providing said surface layer may comprise depositing said layer on said substrate.

In a preferred embodiment, said surface layer is deposited by means of at least one second particle beam.

The step of providing said surface layer may comprise modifying the surface of said substrate by means of at least one particle beam.

In a preferred embodiment, the surface of said substrate is modified by means of at least one said first particle beam.

This provides the advantage that the surface layer from which the structures are to be formed can be formed at substantially the same time as the formation of the substantially regular array of structures, by carrying out both steps by means of the same particle beam or beams.

The method may further comprise the step of adjusting the direction of at least one said first particle beam relative to said surface layer.

This provides the advantage of enabling the nature and/or formation of the substantially regular array of structures to be adjusted.

The adjustment step preferably comprises rotating said surface layer relative to at least one said first particle beam.

The method may further comprise the step of moving at least one said first particle beam relative to said surface layer.

Said step of moving at least one said first particle beam preferably comprises scanning at least one said beam across said surface layer, or moving said surface layer relative to at least one said first particle beam.

The method may further comprise the step of mounting said substrate to an earthed support.

This provides the advantage that under certain circumstances, at least one said particle beam may impact on the earthed support, which may result in at least partial neutralisation of any electrostatic charge building up on the surface layer or on the substrate.

The method may further comprise the step of stabilising said substantially regular array of structures.

In a preferred embodiment, said stabilisation step includes the application of at least one protective coating.

In another preferred embodiment, said stabilisation step includes chemical modification of said substantially regular array of structures.

The method may further comprise the step of at least partially filling at least some gaps between adjacent said structures of said substantially regular array.

In a preferred embodiment, said step of at least partially filling at least some gaps comprises adsorbing at least one gaseous material into material in said gaps.

The step of at least partially filling at least some gaps may comprise depositing material into said gaps.

The method may include directing at least two said first particle beams onto said surface layer, wherein at least two said first particle beams are not parallel to each other.

The method may further comprise the step of forming a plurality of said substantially regular arrays of structures.

In a preferred embodiment, at least two said substantially regular arrays of structures are arranged in separate layers.

Preferred embodiments of the invention will now be described, by way of example only and not in any limitative sense, with reference to the accompanying drawings, in which.

Figure 1:
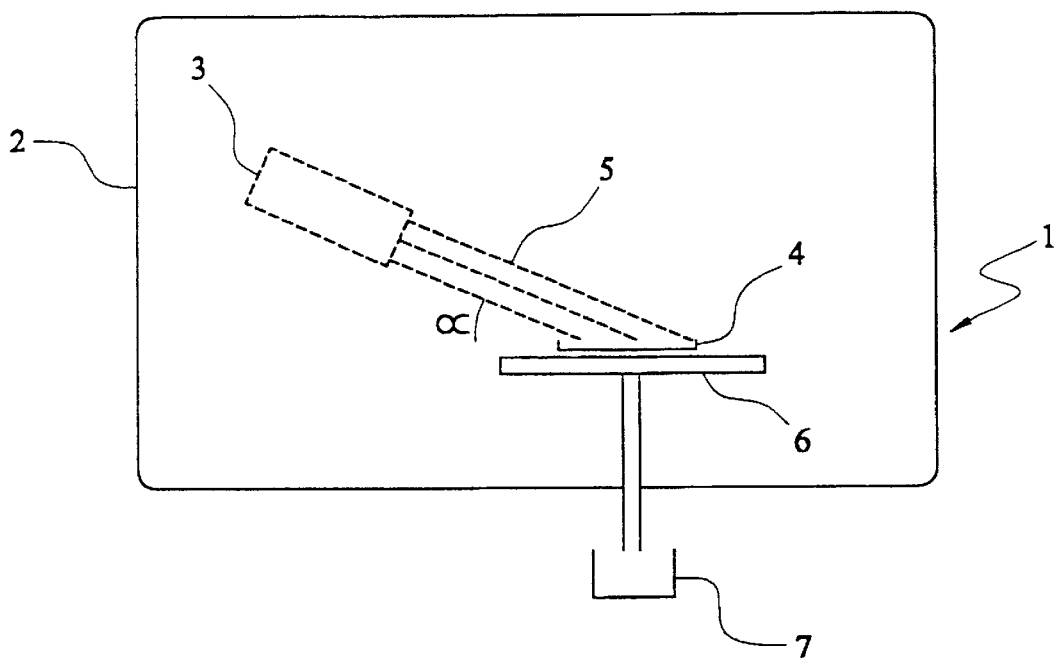
FIG. 1 is a schematic view of an apparatus for carrying out a process of a first embodiment of the present invention.

Referring to FIG. 1, a surface patterning apparatus 1 for forming nanometer sized structures of calcium or calcium-rich material on the surface of a substrate of calcium fluoride comprises a vacuum chamber 2 containing a particle beam source 3 for irradiating a sample 4. The particle beam source 3 directs a particle beam 5 at an angle α onto sample 4, which is mounted to a support 6 such as an earthed aluminium support. The support 6 can be rotated by means of a suitable device 7 such as a motor, the purpose of which will be described in greater detail below.

The operation of the apparatus 1 shown in FIG. 1 will now be described by means of the following example.

EXAMPLE

A sample 4 of calcium fluoride was produced by cleaving a calcium fluoride crystal in air at room temperature and pressure, by striking the crystal with a sharp instrument along a direction that generally coincided with the intersection of a (111) crystal plane with one of the crystal surfaces. The freshly cleaved sample 4 was then placed in the vacuum chamber 2 which was evacuated to a pressure of approximately $4 \times 10^{-8}$ mbar, and the major residual gas components of which were hydrogen and water vapour. Introduction of the sample 4 into the vacuum chamber 2 was assisted by the use for sample introduction of an intermediate small vacuum chamber (not shown) that could be rapidly evacuated to a pressure of approximately $10^{-3}$ mbar.

The sample 4 was mounted to a support 6 comprising an electrically earthed aluminium plate, and was irradiated under an angle of incidence α of approximately 10° to the sample surface by a beam 5 of singly positively charged argon ions having a kinetic energy per incident ion of approximately 4,500 electron volts (eV). The sample 4 was held fixed relative to the ion beam 5 during irradiation, and the ion beam 5 was generated in a commercially available electron impact ion source 3 and was focussed to a small spot of approximately 0.5 millimeter diameter and was scanned across the surface of sample 4 in two mutually perpendicular directions by means of two sets of electrostatic deflection plates (not shown).

The ion beam 5 also impacted on the electrically earthed aluminium plate 6 on which the sample 4 was mounted, which resulted in some emission of electrons from the plate 6, which could at least partially neutralise any positive charge building up on the surface of sample 4 during irradiation. Irradiation by ion beam 5 continued up to a fluence of approximately $3 \times 10^{15}$ ions/mm² of the sample surface.

Figure 2:
FIG. 2 is a magnified view of surface patterning obtained from the process carried out by the apparatus of FIG. 1.

Irradiation of sample 4 by ion beam 5 causes preferential ejection of fluorine atoms from the surface of the sample 4, and the stress field at the interface between the layer of calcium thus formed and the calcium fluoride causes formation of separated, elongated regions of calcium on the calcium fluoride. At the same time, irradiation by means of the ion beam 5 causes the elongated calcium regions thus formed to tend to be aligned along the projection of the axis of ion beam 5 on the surface of sample 4. This is shown in FIG. 2 which represents a plan view of an area of one μm by one μm. The nanometer-scale structures thus formed are of a wire like form, consisting of a topographic array (i.e. having peaks and troughs) of discrete, generally parallel calcium or calcium rich threads aligned along the direction of the projection of the axis of ion beam 5 on the surface of sample 4. The separation of the wirelike structures is approximately 10 nm and is highly uniform, and the pattern thus formed covers the entire area irradiated by the ion beam 5. Such a structure has a number of industrial applications, for example in the fabrication of high resolution optical components.

The sample 4 as shown in FIG. 2 was removed from the vacuum chamber 2 and examined by means of a commercially available atomic force microscope, equipped with ultra sharp silicon probe tips supplied by NT-MDT Ca, Moscow, having a nominal tip end radius of less than 10 nm. Examination of the sample 4 revealed arrays of linear structures which were always found to be generally parallel to the projection of the axis of the ion beam 5 on the sample surface 4, and to be approximately two atoms in height and approximately 10 nm in separation.

The method described with reference to FIG. 1 can under certain circumstances also be used to form multiple layers of such structures by means of sequentially carrying out the method of FIG. 1 described above. For example, the formation of superimposed layers of wire-like structures (arranged directly or indirectly on top of each other) generally at right angles to each other could be used to construct high density memory devices.

Figure 3:
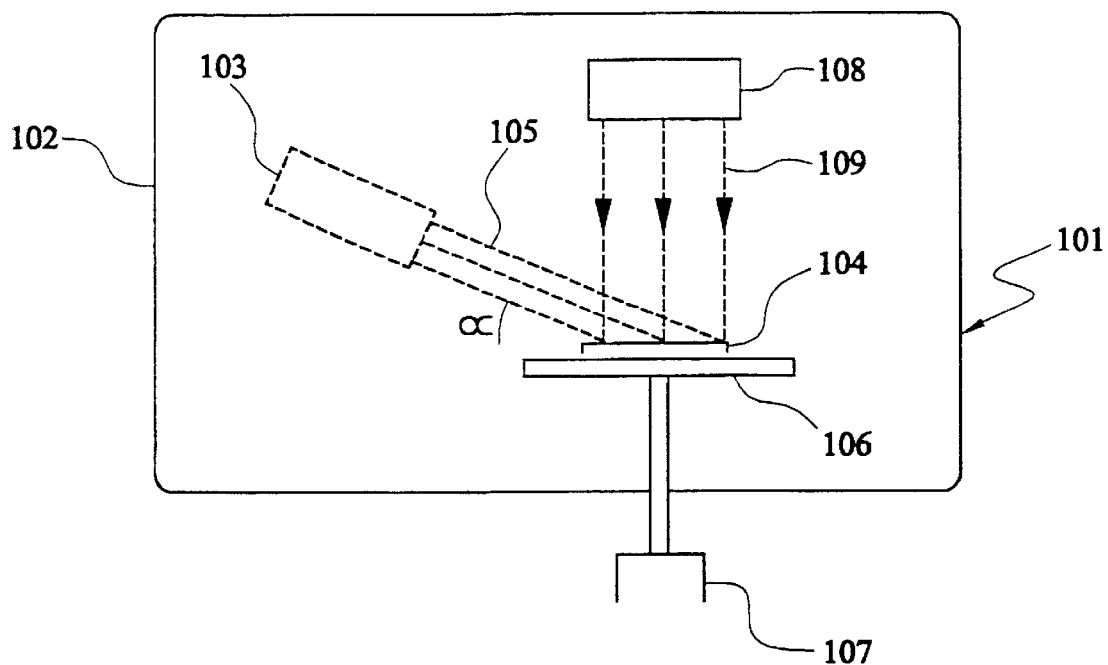
FIG. 3 is a schematic view of an apparatus for carrying out a process of a second embodiment of the present invention.

Referring now to FIG. 3, in which parts common to the embodiment of FIG. 1 are denoted by like reference numerals but increased by 100, a surface patterning apparatus 101 for carrying out a method of a second embodiment of the invention also includes within vacuum chamber 102 a second beam source 108, being a source of atoms, molecules or clusters which are deposited on the surface of sample 104 by means of a second beam 109. This allows material to be deposited on the surface of sample 104 at the same time as, or independently of, irradiation of the sample 104 by means of the first ion beam 105.

In the case of the apparatus 101 of FIG. 3 being used in connection with materials where the stress field between the surface layer and the substrate would tend to cause the formation of compact, non-elongated regions of the material forming the surface layer, f or example semiconducting materials, by rotating the sample 104 relative to the ion beam 105 by means of motor 107 and irradiating the sample in a plurality of directions, dot like structures, as opposed to wire like structures, can be formed. These so-called quantum dots have a number of industrial applications, for example in the formation of display devices. It will be appreciated by persons skilled in the art that the method would most likely be carried out by alternating between two orientations of the sample 104 relative to the ion beam 105, as opposed to carrying out the complete irradiation by the ion beam 105 at each orientation. Alternatively, two ion beams 105 arranged at right angles to each other, or three ion beams at 120° to each other, could be used simultaneously.

The structurally patterned surfaces formed by the methods described above may be applied directly, or may be stabilised by application of a coating or other chemical modification or pacification prior to use. The structurally patterned surface may also be used as a mask or master pattern in subsequent fabrication steps. Furthermore, the gaps between adjacent structures may be at least partially filled, for example by means of adsorption of a gas into the gap separating adjacent peak structures.

It will be appreciated by persons skilled in the art that the above invention has been described by way of example only, and not in any limitative sense, and that various alterations and modifications are possible without departure from the scope of the invention as defined by the appended claims. For example, although the embodiment described with reference to FIGS. 1 and 2 relates to calcium structures formed on a calcium fluoride substrate, it will be appreciated by persons skilled in the art that the method of the invention can be applied to a large number of materials where stress fields cause the formation of separated regions of a first material on a substrate of a second material.

We claim:

1. A method of forming a substantially regular array of structures on a substrate, the method comprising:

providing a surface layer of a first material on a substrate of a second material, wherein said surface layer is sufficiently thin that stress fields at the interface of said surface layer and said substrate cause formation of separated regions of said first material on said substrate; and directing at least one first particle beam onto said surface layer and at a respective acute angle thereto to influence the direction of alignment of said separated regions and/or the relative position of adjacent said separated regions.

2. A method according to claim 1, wherein the step of providing said surface layer comprises depositing said layer on said substrate.

3. A method according to claim 2, wherein said surface layer is deposited by means of at least one second particle beam.

4. A method according to claim 1, wherein the step of providing said surface layer comprises modifying the surface of said substrate by means of at least one particle beam.

5. A method according to claim 4, wherein the surface of said substrate is modified by means of at least one said first particle beam.

6. A method according to claim 5, further comprising the step of adjusting the direction of at least one said first particle beam relative to said surface layer.

7. A method according to claim 6, wherein the adjustment step comprises rotating said surface layer relative to at least one said first particle beam.

8. A method according to claim 5, further comprising the step of moving at least one said first particle beam relative to said surface layer.

9. A method according to claim 8, wherein said step of moving at least one said first particle beam comprises scanning at least one said beam across said surface layer, or moving said surface layer relative to at least one said first particle beam.

10. A method according to claim 1, further comprising the step of mounting said substrate to an earthed support.

11. A method according to claim 1, further comprising the step of stabilising said substantially regular array of structures.

12. A method according to claim 11, wherein said stabilisation step includes the application of at least one protective coating.

13. A method according to claim 11, wherein said stabilisation step includes chemical modification of said substantially regular array of structures.

14. A method according to claim 1, further comprising the step of at least partially filling at least some gaps between adjacent said structures of said substantially regular array.

15. A method according to claim 14, wherein said step of at least partially filling at least some gaps comprises adsorbing at least one gaseous material into said gaps.

16. A method according to claim 14, wherein the step of at least partially filling at least some gaps comprises depositing material into said gaps.

17. A method according to claim 1, including directing at least two said first particle beams onto said surface layer, wherein at least two said first particle beams are not parallel to each other.

18. A method according to claim 1, further comprising the step of forming a plurality of said substantially regular arrays of structures.

19. A method according to claim 18, wherein at least two said substantially regular arrays of structures are arranged in separate layers.

* * * * *